United States Patent
Tröger et al.

[11] Patent Number: 6,147,396
[45] Date of Patent: Nov. 14, 2000

[54] POWER SEMICONDUCTOR MODULE

[75] Inventors: Wolfgang Tröger, München; Alfons Graf, Kaufering, both of Germany

[73] Assignee: Infineon Technologies Aktiengesellschaft, Munich, Germany

[21] Appl. No.: 09/250,363

[22] Filed: Feb. 12, 1999

[30] Foreign Application Priority Data

Feb. 12, 1998 [DE] Germany ............... 198 05 785

[51] Int. Cl.[7] .................................. H01L 23/495
[52] U.S. Cl. ............................ 257/666; 257/528
[58] Field of Search .................. 257/666, 528, 257/401, 723, 724

[56] References Cited

U.S. PATENT DOCUMENTS 5,068,706  11/1991  Sugita et al. .
5,543,632   8/1996  Ashley .
5,945,728   8/1999  Dobkin et al. .
5,998,856  12/1999  Noda et al. .
6,002,166  12/1999  Noda et al. .

*Primary Examiner*—Sheila V. Clark
*Attorney, Agent, or Firm*—Herbert L. Lerner; Laurence A. Greenberg; Werner H. Stemer

[57] ABSTRACT

A power semiconductor module includes a lead frame, at least one power semiconductor component fastened on said lead frame, a housing at least partly encapsulating said power semiconductor component, a plurality of output lines electrically conductively connected to said power semiconductor component and including load current-carrying output lines, electrically conductive connections between said at least one power semiconductor component and at least said load current-carrying output lines, and an interrupter. The interrupter irreversibly interrupts at least said load current-carrying output lines and/or said electrically conductive connections and at least said load current-carrying output lines, if the temperature of said power semiconductor component exceeds a predetermined temperature threshold. The interrupter is formed of a material having a volume-expanding and/or an oxidizing and/or an explosive characteristic with an increasing temperature.

13 Claims, 2 Drawing Sheets

POWER SEMICONDUCTOR MODULE

BACKGROUND OF THE INVENTION

FIELD OF THE INVENTION

The invention relates to a power semiconductor module, including at least one power semiconductor component fastened on a lead frame, at least partly encapsulated by a housing and electrically conductively connected to a plurality of output lines. The power semiconductor module has an interrupter irreversibly interrupting at least load current-carrying output lines and/or electrically conductive connections between the power semiconductor component and at least the load current-carrying output lines, in the event that the temperature of the power semiconductor component exceeds a predetermined temperature threshold.

When semiconductor components such as, for example, power switches are used, a fault or a failure can never be completely ruled out, which is the case, in principle, with all electrical devices. One possible fault situation is, for example, a so-called break-down or melt-through. In that case, for example in a high-side switch, a low-resistance connection is produced between the supply voltage source and the output terminal or, in the case of a low-side switch, a low-resistance connection of the output terminal to the device ground is produced. The electric current through the connected load circuit of the respective power switch can no longer be influenced by the driving logic configuration. Consequently, the load current is limited only by the resistance of the load in the load circuit.

In the event that the load likewise has a fault leading to short-circuiting of the load, the load current is limited only by the performance of the voltage supply and, consequently, by the internal resistance thereof. Consequently, a load current corresponding to the maximum current of the voltage supply permanently flows at the output of the power switch. That maximum load current typically causes uncontrolled heating of the power switch, which can cause a fire in the worst-case scenario.

A fuse, for example a thin resistance wire, is typically used as a precaution against such an occurrence. The fuses are connected into the load circuit between the supply voltage source and the semiconductor switch. The fuse interrupts the load circuit in the event of an excessively large current. In addition, a temperature sensor will typically be used which switches off the power switch in the event of excessive heating of the power switch that is caused, for example, by an excessively large load current or short-circuit current.

However, that precaution works only as long as the component is not defective.

U.S. Pat. No. 5,068,706 describes a three-phase rectifier having a fuse which melts in a defined manner if the semiconductor components exceed a predetermined temperature. That prevents the component from being destroyed.

However, the risk of the power switch having a low-resistance fault or short circuit, and at the same time the risk of the load to be switched likewise having a short circuit, is consciously accepted as an improbable double fault. If that double fault nevertheless occurs, the possible damage caused by a fire is disproportionately high and cannot be estimated.

SUMMARY OF THE INVENTION

It is accordingly an object of the invention to provide a power semiconductor module, which overcomes the hereinaforementioned disadvantages of the heretofore-known devices of this general type and in which a load circuit of a power semiconductor component is reliably interrupted in the event of impermissibly high heating.

With the foregoing and other objects in view there is provided, in accordance with the invention, a power semiconductor module, comprising a lead frame; at least one power semiconductor component fastened on the lead frame; a housing at least partly encapsulating the at least one power semiconductor component; a plurality of output lines electrically conductively connected to the at least one power semiconductor component, the output lines including load current-carrying output lines; electrically conductive connections between the at least one power semiconductor component and at least the load current-carrying output lines; and at least one interrupter irreversibly interrupting at least the load current-carrying output lines and/or the electrically conductive connections and at least the load current-carrying output lines, if a temperature of the at least one power semiconductor component exceeds a predetermined temperature threshold, the at least one interrupter formed of a material having a volume-expanding and/or an oxidizing and/or an explosive characteristic with an increasing temperature.

By virtue of this configuration, in the case of a power semiconductor component which is heated to temperatures above a predetermined, specified temperature range due to an impermissibly high load current, the load circuit is irreversibly interrupted in a defined manner. This irreversible interruption destroys the power semiconductor component, which is unusable in any case. At the same time, a very much higher level of damage, caused by an equipment fire, for example, is avoided.

In this case, materials are provided in the housing of the power semiconductor module or are fixedly encapsulated by the housing by molding. When a previously specified, critical temperature is exceeded, those materials interrupt the load circuit in the power semiconductor switch in such a manner that the housing and/or the load current-carrying bonding wires and/or output lines are irreversibly destroyed.

In accordance with another feature of the invention, the housing is formed of a molding composition, and the at least one interrupter is contained at least partly as a constituent of the molding composition.

In accordance with a further feature of the invention, the at least one interrupter at least partly contains explosive, or magnesium carbonate ($MgCO_3$), or silver bromide.

In accordance with an added feature of the invention, the housing is formed of plastic material having a foaming characteristic when the predetermined temperature threshold is reached, and the at least one interrupter is contained in the plastic material. In accordance with an additional feature of the invention, the at least one interrupter at least partly contains polyamide 6.6.

In accordance with yet another feature of the invention, the at least one interrupter is enclosed by the housing and is at least partly composed of an approximately ideal gas.

In accordance with yet a further feature of the invention, the output lines are terminal lines, and the electrically conductive connections are bonding wires connecting the terminal lines to the at least one power semiconductor component.

In accordance with yet an added feature of the invention, the at least one interrupter is disposed in direct proximity to the at least one power semiconductor component.

In accordance with yet an additional feature of the invention, the at least one power semiconductor component and the output lines define an intermediate region therebetween, and the at least one interrupter is at least partly disposed in the intermediate region.

In accordance with again another feature of the invention, the electrically conductive connections are bonding wires contacting at least the load current-carrying output lines at a given contact location, and the at least one interrupter is also disposed in direct proximity to the given contact location.

In accordance with a concomitant feature of the invention, the bonding wires are formed of a material, the output lines are formed of a material, and the at least one interrupter is at least partly alloyed in the material of at least one of the bonding wires and the output lines.

Other features which are considered as characteristic for the invention are set forth in the appended claims.

Although the invention is illustrated and described herein as embodied in a power semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1A:
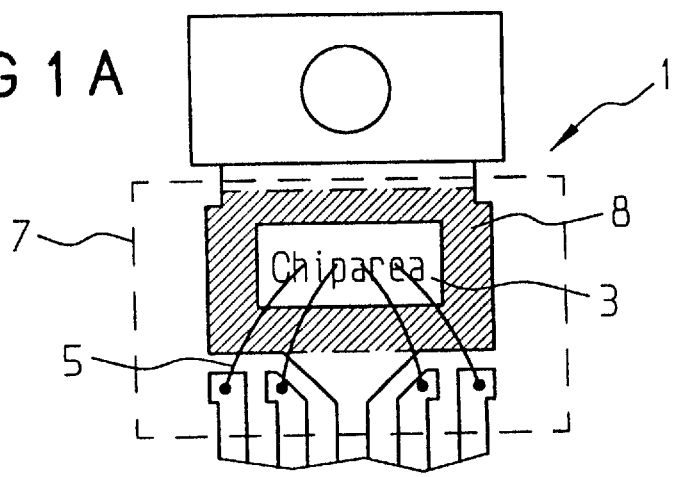
FIGS. 1A to 1E are fragmentary, diagrammatic, plan views showing a structure of an inventive power semiconductor module for carrying out a method according to the invention, with interrupters disposed differently in a housing of the power semiconductor module.

DESCRIPTION OF THE PREFERRED EMBODIMENTS:

Referring now to the figures of the drawings in detail and first, particularly, to FIGS. 1A to 1E thereof, there are seen various exemplary embodiments of a structure of an inventive power semiconductor module for carrying out a method according to the invention. In this case, identical or functionally identical parts are provided with the same reference symbols in the various exemplary embodiments.

The power semiconductor module is designated by reference numeral 1. The power semiconductor module 1 includes a lead frame 2. An individual power semiconductor component 3 is mounted on the lead frame 2. However, it would also be conceivable to place a plurality of power semiconductor components 3 on the lead frame 2. The power semiconductor components 3 that are used are any type of power switches, such as, for example, high-side switches, low-side switches, bridge switches, etc. However, the inventive method and the inventive configuration can also be used with all other components in which uncontrolled levels of heating ought to be avoided as far as possible.

In the present exemplary embodiment, the semiconductor component 3 is connected to the lead frame 2 through the use of a soft-soldering joint, for example. This soft-soldering joint typically has good electrical as well as good thermal conductivity. In this case, terminals 6, which are likewise electrically conductively connected to the lead frame 2, are terminal lines for a potential of a device ground.

The power semiconductor module 1 additionally has a multiplicity of output lines 4, which are electrically conductively connected to corresponding contact points of the power semiconductor component 3 through connecting lines 5, in the present exemplary embodiment. Bonding wires are preferably used as the connecting lines 5. However, metal straps or the like are conceivable as the conductive connection. In this case the terminal lines may include a further line system which is composed of sheet metal, for example.

Figure 1B:
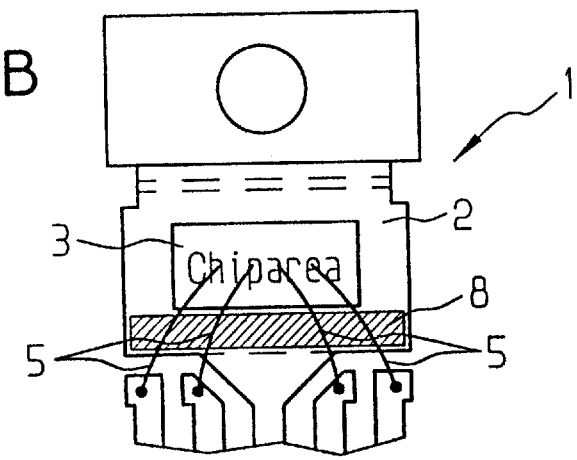
Figure 1C:
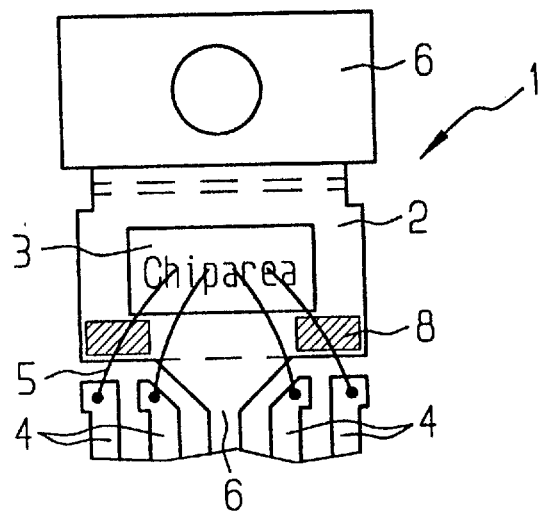
Figure 1D:
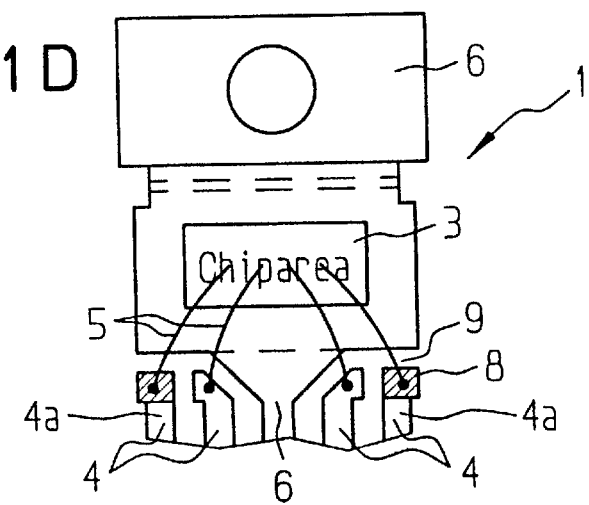

The load current-carrying output lines are designated by reference symbol 4a in FIG. 1D. In the present exemplary embodiment, the output lines 4 are spaced apart from the lead frame 2, and consequently from the power semiconductor component 3, by an interspace 9.

The power semiconductor module is encapsulated in order to fix the output lines 4 in a defined manner relative to the lead frame 2 and also in order to protect the power semiconductor component 3 as well as its bonding wires 5 against external influences such as, for example, moisture, corrosion, mechanical stress, etc. The encapsulation, which is illustrated by dashes in FIG. 1A, is provided by a housing 7 in such a way that only the output lines 4 and ground lines 6 project from the housing 7. The terminal lines 4, 6 are also the housing terminals in this case. The housing 7 is typically composed of plastic material but can also be composed of other materials. In this case, the plastic material is typically molded into the desired form during production.

In the present example, a so-called TO housing structural part is shown in FIG. 1. However, the invention relates to all conceivable housing structural parts.

Interrupters are designated by reference numeral 8. In the exemplary embodiments shown in FIGS. 1A–1E, the interrupters 8 are fixedly encapsulated by molding or are part of the housing 7 itself. However, this is not absolutely necessary. It would also be conceivable for the interrupters to be disposed at least partly outside the housing 7, for example around the load current-carrying output lines 4a, outside the housing surface, etc.

The method employed is explained in more detail below:

Typically, the material of the interrupters 8, which is also referred to as interruption material in the text below, is fixedly encapsulated by the housing 7 by molding or is part of the housing 7 itself. When a predetermined critical temperature is exceeded, the housing 7 is typically destroyed by the interruption material in such a way that at least the load-carrying bonding wires 5 and/or at least the load-carrying output lines 4a and/or the power semiconductor component 3 itself are/is also destroyed or irreversibly interrupted. As a result of this interruption, the load circuit of the power semiconductor component 3 is likewise interrupted.

That temperature at which the semiconductor component is intended to be destroyed in a defined and reliable manner is referred to as a critical temperature Tz in the text below. Typically, the critical temperature is significantly above the temperature during normal operation of the semiconductor component, as well as above the temperatures arising in the production process of the housing structural part.

However, it would also be conceivable for the interruption material 8 to be part of the (current-carrying) output lines 4, 4a or the corresponding bonding wires 5 leading to the semiconductor component 3. In this case, these lines are destroyed directly by the interrupters 8.

In this case, the following three preferred mechanisms for interruption are proposed:

1. Starting from the critical temperature, the interruption material changes the bonding wire 5 or the (load-carrying) output lines 4, 4a chemically, for example by oxidizing the interruption material. In this way, the bonding wires 5 or the output lines 4, 4a acquire a high resistance, as a result of which the load circuit is interrupted. In this case, it is advantageous if the interruption material is alloyed into the material of the bonding wire 5 or of the output lines 4, 4a. It would also be conceivable for the interruption material to be contained on the surface of the output lines 4, 4a or the bonding wires 5 or in the line core thereof.

2. The interruption material which, by way of example, but not necessarily, is a gas, changes its volume with increasing temperature in such a way that the interruption material expands to a very great extent as the temperature rises. However, since the interruption material is fixedly enclosed by the housing 7 or is part of the housing 7, volume expansion of the interruption material with an increasing temperature is possible only to a limited extent. However, an increase in pressure is exerted on the housing 7. If the critical temperature is exceeded, the pressure has become too great for the housing 7, with the result that the housing 7 is abruptly destroyed. The bonding wires 5, which are constructed to be relatively thin in comparison with the output lines 4, are torn away or interrupted by the destruction of the housing 7 and the load current is reliably and irreversibly interrupted in a defined manner in this way.

3. The additional material ignites or explodes starting from the critical temperature and, consequently, blows up the housing 7 and therefore the bonding wires 5 in an equivalent manner to that described under mechanism 2.

Figure 2:
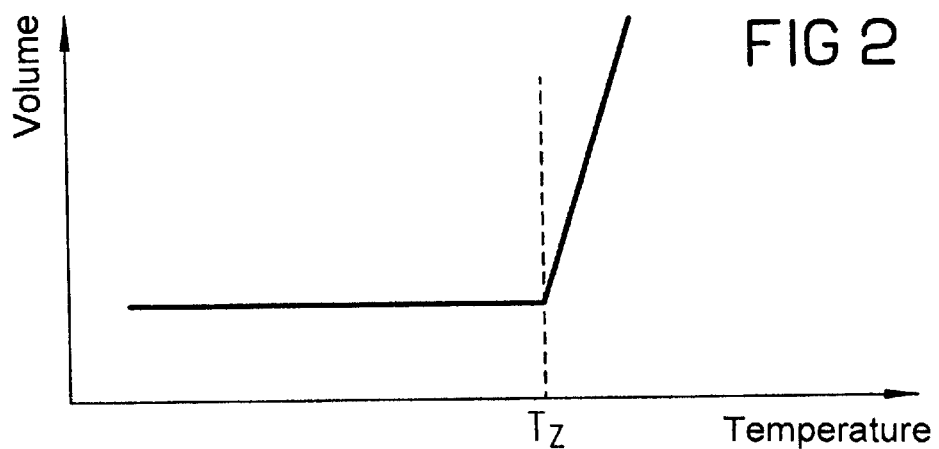
FIG. 2 is a graph showing a temperature-volume characteristic curve of the interrupters which are used, that is striven for and is similar to a diode.

In principle, all materials having a diode-like temperature-volume characteristic curve in accordance with FIG. 2 are suitable as the interruption material. By way of example, a number of concrete examples are listed below, but these examples should not be interpreted as a definitive collection in this case:

a) The simplest possibility is introducing small air bubbles into the housing 7. The housing will then be destroyed in accordance with the $2^{nd}$ mechanism. However, any other gas which is introduced into small cavities in the housing 7 and approximates an ideal gas in its behavior with an increasing temperature would also be conceivable.

b) A further possibility is the use of an interruption material which, starting from the critical temperature, begins to liberate a great deal of gas and in this way destroys the housing 7 and, consequently, also the bonding wires 5 in accordance with the $2^{nd}$ mechanism.

c) A thoroughly effective measure would be the use of an explosive having an ignition temperature that lies in the region of the critical temperature. The ignition temperature of customary explosives usually lies in the range between 350° C. and 700° C. In particular, a firing pellet would be conceivable in this case as the interruption material, similarly to the case of an airbag. Silver bromide, which ignites at a temperature of about 170° C., would also be conceivable. When proportioning the quantity of explosive, it must be ensured that only the housing 7 and, consequently, the bonding wires 5, but not adjacent components and/or the circuit board itself, are destroyed by the explosion ($3^{rd}$ mechanism).

d) A further possibility would be the use of plastics as the housing material which, starting from the critical temperature, begin to expand to a great extent, for example by foaming ($2^{nd}$ mechanism 2). One example thereof would be polyamide or nylon 6.6. It would also be conceivable for this plastic material to be enclosed by the housing material.

e) Finally, interruption materials which, starting from the critical temperature, oxidize to a great extent ($1^{st}$ mechanism), such as, for example, magnesium carbonate ($MgCO_3$), would also be conceivable. At a temperature of about 540° C., $MgCO_3$ oxidizes to form $CO_2+MgO$.

The above list of possible materials as the interrupters 8 should be interpreted merely as advantageous exemplary embodiments and therefore is not definitive. In general, all materials having a diode-like volume-temperature characteristic curve in accordance with FIG. 2 are suitable.

As already mentioned, a number of examples of a possible site for incorporation of the above-mentioned interruption materials are illustrated in FIGS. 1A to 1E.

In FIG. 1A, the interruption material is applied on a large area of the lead frame 2. In this case, the interruption material is disposed around the entire semiconductor component 3. When the critical temperature is reached, the housing 7 is blown up, and consequently the bonding wires 5 are interrupted.

In FIGS. 1B and 1C, the interruption material is disposed only on the edge of the lead frame 2 on the side toward the output lines 4. When the critical temperature is reached, in this case the bonding wires 5 are either immediately interrupted or are torn away from the semiconductor component 3 and/or its output lines 4 by virtue of the housing 7 blowing up at this location. In contrast to FIG. 1B, for economical reasons, in the case of FIG. 1C the interrupters 8 are disposed only in the vicinity of those bonding wires 5 which connect the semiconductor component to the load current-carrying output lines 4a.

In FIG. 1D, the interrupters 8 are disposed exclusively at the contact point between the load current-carrying bonding wires and the corresponding output lines 4a.

Figure 1E:
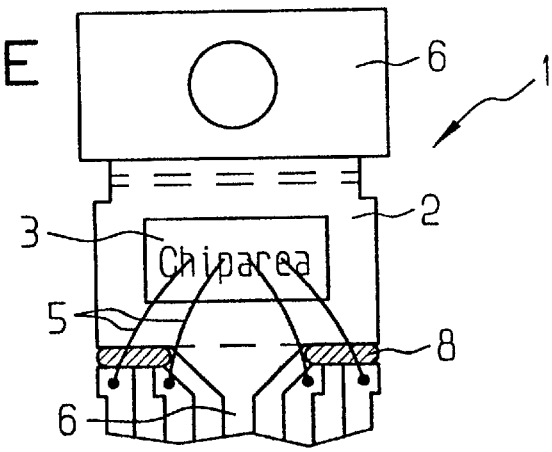

In FIG. 1E, the interrupters 8 are disposed in the interspace 9 which separates the lead frame 2 and the output lines 4 from one another.

Furthermore, it is also possible to apply the interrupters on the bonding wire 5 itself and/or on the output lines 4 themselves, in a non-illustrated manner.

It is particularly advantageous for the interrupters to be alloyed into the material of the bonding wires 5 and/or of the output lines 4. The alloying of the interrupters is preferred particularly when the corresponding lines are intended to be interrupted by oxidation when the critical temperature is reached in accordance with the $1^{st}$ mechanism.

However, it is particularly advantageous if the interrupters 8 are introduced directly into the plastic molding composition of the housing 7, which is likewise not illustrated in FIG. 1.

It is particularly advantageous if the housing 7 is notched in a suitable manner at a location which is intended to be destroyed. As a result, a desired breaking point is produced, the advantages of which are explained below:

The interruption is facilitated. The quantity of interruption material being used can thus be reduced.

The direction in which the housing corner to be blown up is possibly hurled away can be defined. Consequently, the interruption is reproducible to the greatest possible extent and a possible hazard to sensitive parts in the vicinity can be avoided.

The exemplary embodiments shown in FIGS. 1A to 1E are in no way exhaustive. The invention can be applied to all conceivable semiconductor components in which the current in the current-carrying line is intended to be interrupted when a critical temperature is reached.

The critical temperature at which the semiconductor component is intended to be destroyed can equally be established by the targeted choice of the interruption materials being used and/or the proportioning thereof.

We claim:

1. A power semiconductor module, comprising:
    a lead frame;
    at least one power semiconductor component fastened on said lead frame;
    a housing at least partly encapsulating said at least one power semiconductor component;
    a plurality of output lines electrically conductively connected to said at least one power semiconductor component, said output lines including load current-carrying output lines;
    electrically conductive connections between said at least one power semiconductor component and at least said load current-carrying output lines; and
    at least one interrupter irreversibly interrupting at least one of:
       at least said load current-carrying output lines, and
       said electrically conductive connections and at least said load current-carrying output lines,
    if a temperature of said at least one power semiconductor component exceeds a predetermined temperature threshold, said at least one interrupter formed of a material having at least one of a volume-expanding, an oxidizing and an explosive characteristic with an increasing temperature.

2. The power semiconductor module according to claim 1, wherein said housing is formed of a molding composition, and said at least one interrupter is contained at least partly as a constituent of said molding composition.

3. The power semiconductor module according to claim 1, wherein said at least one interrupter at least partly contains explosive.

4. The power semiconductor module according to claim 2, wherein said at least one interrupter at least partly contains magnesium carbonate ($MgCO_3$).

5. The power semiconductor module according to claim 2, wherein said at least one interrupter at least partly contains silver bromide.

6. The power semiconductor module according to claim 2, wherein said housing is formed of plastic material having a foaming characteristic when the predetermined temperature threshold is reached, and said at least one interrupter is contained in said plastic material.

7. The power semiconductor module according to claim 6, wherein said at least one interrupter at least partly contains polyamide 6.6.

8. The power semiconductor module according to claim 2, wherein said at least one interrupter is enclosed by said housing and is at least partly composed of an approximately ideal gas.

9. The power semiconductor module according to claim 2, wherein said output lines are terminal lines, and said electrically conductive connections are bonding wires connecting said terminal lines to said at least one power semiconductor component.

10. The power semiconductor module according to claim 2, wherein said at least one interrupter is disposed in direct proximity to said at least one power semiconductor component.

11. The power semiconductor module according to claim 2, wherein said at least one power semiconductor component and said output lines define an intermediate region therebetween, and said at least one interrupter is at least partly disposed in said intermediate region.

12. The power semiconductor module according to claim 2, wherein said electrically conductive connections are bonding wires contacting at least said load current-carrying output lines at a given contact location, and said at least one interrupter is disposed in direct proximity to said given contact location.

13. The power semiconductor module according to claim 2, wherein said bonding wires are formed of a material, said output lines are formed of a material, and said at least one interrupter is at least partly alloyed in said material of at least one of said bonding wires and said output lines.

* * * * *